United States Patent
Sakai et al.

(10) Patent No.: US 6,573,658 B1
(45) Date of Patent: *Jun. 3, 2003

(54) MERCURY LAMP OF THE SHORT ARC TYPE AND UV EMISSION DEVICE

(75) Inventors: Motohiro Sakai, Himeji (JP); Yoshinori Aiura, Himeji (JP); Yukio Yasuda, Himeji (JP); Tatsumi Hiramoto, Tokyo (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/468,829

(22) Filed: Dec. 22, 1999

(30) Foreign Application Priority Data

Dec. 22, 1999 (JP) .............................. 10-365102

(51) Int. Cl.[7] .......................... H01J 17/20; H01J 61/12; H01J 61/20
(52) U.S. Cl. ...................... 313/642; 313/634; 313/639; 313/571
(58) Field of Search ................. 313/642, 570, 313/571, 637, 639, 634

(56) References Cited

U.S. PATENT DOCUMENTS

| | | | |
|---|---|---|---|
| 4,704,346 A | * 11/1987 | Hiramoto et al. | 313/571 |
| 4,732,842 A | 3/1988 | Kira | |
| 5,402,037 A | * 3/1995 | Irisawa et al. | 313/570 |
| 5,497,049 A | * 3/1996 | Fischer | 313/571 |
| 5,594,302 A | * 1/1997 | Yakub et al. | 313/571 |
| 5,920,152 A | * 7/1999 | Yasuda et al. | 313/570 |
| 6,107,742 A | * 8/2000 | Seki et al. | 313/637 |
| 6,163,111 A | * 12/2000 | Yasuda et al. | 313/573 |

FOREIGN PATENT DOCUMENTS

| | | |
|---|---|---|
| DE | 44 32 315 | 3/1996 |
| GB | 2 171 214 | 8/1986 |
| JP | 7-226186 | 8/1995 |

OTHER PUBLICATIONS

Database WPI, Section PQ, Week 1999625, Derwent Publications Ltd., London, GB; AN 1996–248951, XP002133113 & JP 08 102287 A (Toshiba Lightech KK), Apr. 16, 1996, English Abstract.

* cited by examiner

*Primary Examiner*—Michael H. Day
*Assistant Examiner*—Matt Hodges
(74) *Attorney, Agent, or Firm*—Nixon Peabody LLP; David S. Safran

(57) ABSTRACT

A mercury lamp of the short arc type which can stably emit an intense spectrum at a wavelength of 365 nm with an extremely narrowed band region over a long time, and which has an anode and a cathode disposed opposite one another in a silica glass arc tube which is filled with mercury and a rare gas, is achieved by the amount of mercury being less than or equal to 1.0 mg/cc of the inside volume of the arc tube and at least one of the gases argon (Ar) and krypton (Kr) are used as the rare gas at room temperature with 1.0 to 8.0 atm.

6 Claims, 4 Drawing Sheets

|  | Lamp A | Lamp B | Lamp C |
|---|---|---|---|
| Amount of mercury (mg/cc) | 0.8 | 0.8 | 5 |
| Rare gas (atm) | Argon 8 atm | Xenon 5 atm | Xenon 1 atm |
| Relative radiation intensity (360–370 nm) | 103 | 77 | 100 |
| Relative radiation intensity (364.5–365.5 nm) | 53 | 38 | 36 |
| Purity of the i-line (364.5–365.5 nm)/(360–370 nm) | 0.51 | 0.5 | 0.36 |

| Lamp No. | R(cm) | Bulb thickness d(cm) | Power W(kW) | (Wd)½/R | Assessment |
|---|---|---|---|---|---|
| X1 | 2.0 | 0.40 | 2.0 | 0.447 | Devitrification of the bulb |
| X2 | 2.0 | 0.40 | 1.5 | 0.387 | 0 |
| X3 | 3.0 | 0.30 | 2.0 | 0.258 | 0 |
| X4 | 3.0 | 0.20 | 2.0 | 0.211 | 0 |
| X5 | 4.0 | 0.30 | 2.0 | 0.194 | Nonvaporization of the mercury |

Fig.5

| Lamp No. | R(cm) | Bulb thickness d(cm) | Power W(kW) | (Wd)½/R | Assessment |
|---|---|---|---|---|---|
| Y1 | 2.0 | 0.40 | 2.0 | 0.447 | Devitrification of the bulb |
| Y2 | 2.0 | 0.35 | 4.5 | 0.418 | 0 |
| Y3 | 3.0 | 0.30 | 2.0 | 0.258 | 0 |
| Y4 | 3.0 | 0.45 | 1.5 | 0.205 | 0 |
| Y5 | 4.0 | 0.30 | 2.0 | 0.194 | Nonvaporization of the mercury |

Fig.6

| Lamp No. | R(cm) | Bulb thickness d(cm) | Power W(kW) | (Wd)½/R | Assessment |
|---|---|---|---|---|---|
| Z1 | 3.0 | 0.35 | 4.5 | 0.418 | Devitrification of the bulb |
| Z2 | 2.0 | 0.40 | 1.5 | 0.387 | 0 |
| Z3 | 3.0 | 0.30 | 2.0 | 0.258 | 0 |
| Z4 | 4.0 | 0.35 | 2.0 | 0.209 | 0 |
| Z5 | 4.0 | 0.30 | 2.0 | 0.194 | Nonvaporization of the mercury |

Fig.7

MERCURY LAMP OF THE SHORT ARC TYPE AND UV EMISSION DEVICE

BACKGROUND OF THE INVENTION

1. Field of the Invention

The invention relates to a mercury lamp of the short arc type in which an anode and a cathode are disposed opposite one another in a silica glass arc tube which is filled with mercury and a rare gas.

2. Description of Related Art

Recently, exposure technology using a mercury lamp of the short arc type has been utilized as the light source in photolithography in the production of semiconductors and liquid crystals, and in other areas of precision machining.

A mercury lamp of the short arc type is used as a light source in this photolithography and it emits, with high efficiency, light with a wavelength of 365 nm (i-line) at which the photoresist has its sensitivity. The lamp is filled with mercury as the emission substance and with a rare gas, such as argon, krypton or the like, as the starting gas.

On the other hand, there is a mercury lamp of the short arc type in which, together with mercury, xenon gas is also added as an emission substance (for example, published Japanese Patent Application SHO 61-189636 and U.S. Pat. No. 4,732,842).

Emission from the above described mercury lamp at wavelengths around 365 nm has a broadening of a few mm. When a refraction optics system of a single type of glass is used in an exposure device, therefore, blurring of the image occurs due to chromatic aberration, causing nonuniformity of the exposure and a reduction of the image resolution. Then, the demand for the above required miniaturization can no longer be met. To correct this chromatic aberration, an achromatic lens is used in which some glass materials with different indices of refraction are combined with one another. However, since the wavelength used is short, the choice of glass materials to be used is small. Therefore, the chromatic aberration can no longer be completely eliminated.

Thus, it can be imagined that light in a narrower waveband range passes though the refraction optics system. For example, a process was proposed in which the light emitted by the lamp passes through a bandpass filter (BPF) which transmits only a certain waveband range in the vicinity of the i-line. But, even a bandpass filter has its limit of efficiency and its material is also tremendously expensive.

In order to advantageously suppress chromatic aberration using limited optical materials, it is necessary for the light to have a narrow spectral width of the i-line which is emitted by the lamp itself. Of course, the irradiance of the lamp should not be reduced. Therefore, while maintaining sufficiently high irradiance, a narrow spectral width of the i-line can be obtained.

Furthermore, a discharge lamp is known in which, not only during starting, but also during steady-state operation xenon gas is used. The mercury lamp, which is described, for example, in published Japanese Patent Application SHO 61-189636, is filled with xenon gas at pressure of up to 5 atm. In such a mercury lamp, however, besides the intense spectrum of the mercury at 365 nm, the continuous spectrum of the xenon is used. Since xenon is used, the irradiance at 365 nm (more exactly in the range of 365±0.5 nm) is low. Therefore, in a mercury lamp which is filled with xenon as the rare gas, the irradiance of the i-line is inherently insufficient even if xenon is used in steady-state operation.

SUMMARY OF THE INVENTION

Therefore, a primary object of the present invention is to devise a mercury lamp of the short arc type in which, without reducing the irradiance, the spectral width of the i-line can be reduced.

Furthermore, another object of the invention is to devise an emission device for achieving the above object.

In a mercury lamp of the short arc type in which there are an anode and a cathode opposite one another in a silica glass arc tube which is filled with mercury and a rare gas, these objects are achieved in accordance with the invention in that the amount of mercury added is less than 1.0 mg/cc of the inside volume of the arc tube, and the rare gas includes at least argon (Ar) or krypton (Kr) or a mixture of these gases that is added at room temperature with a pressure of 1.0 to 8.0 atm.

By means of this arrangement, the mercury lamp of the short arc type according to the invention can emit an i-line with a narrow spectral width at a wavelength of 365 nm since the amount of mercury added is somewhat less than in a conventional mercury lamp of the short arc type. The amount of mercury in the invention is less than 1.0 mg/cc, preferably greater than or equal to 0.5 mg/cc and less than 1.0 mg/cc.

In this way, the emission of the i-line (in the range of 365±0.5 nm) can be increased, and at the same time, emission can be greatly reduced in the range of 365±5 nm from which the range of 365±0.5 nm is extracted.

However, by reducing the amount of mercury, a new problem arises, specifically a reduction of the irradiance, if the entire lamp is considered.

In a mercury lamp of the short arc type in accordance with the invention, this defect can be eliminated by increasing the amount of argon and krypton added.

In a mercury lamp of the short arc type which is filled with xenon gas or the like as an auxiliary starting gas, the amount of xenon gas added is generally at most roughly 0.1 to 1.0 atm, i.e., it is extremely low. The reason for this is that the purpose is for it to act as a starting aid.

In view of the defect noted above relative to the known use of Xenon, not only during starting, but also during steady-state operation xenon gas, the inventors have found that even when the amount of mercury is reduced, the band region of the i-line can be made narrower and sufficient irradiance can be achieved when argon or krypton or a mixture of these gases is used instead of xenon gas as the rare gas. They have found that it is effective if specifically when adding argon or krypton alone, the pressure is 1 to 8 atm, and when adding the gas mixture, the pressure in the mixed state is 1 to 8 atm.

The above objects are achieved in accordance with one preferred aspect of the invention by argon being used as the rare gas and that the condition $0.211 \leq ((Wd)^{1/2}/R) \leq 0.387$ being met where R is half the maximum diameter of the arc tube in the radial direction in cm, d is the thickness of the arc tube in cm, and W is the input power in kW, the radial direction being defined as the direction of the cross section which is perpendicular to the axial direction which runs between the anode and the cathode.

The objects are achieved in another aspect of the invention when, using krypton as the rare gas, the condition $0.205 \leq ((Wd)^{1/2}/R) \leq 0.418$ is met.

The objects are achieved in still another aspect of the invention using a mixture of argon and krypton as the rare gas in a manner fulfilling the condition $0.209 \leq ((Wd)^{1/2}/R) \leq 0.387$.

The invention is characterized, in one aspect, by the fact that, when argon (Ar) or krypton (Kr) at a pressure of a few atmospheres or a mixture of these gases in a given pressure range is added, given numerical values are fixed with consideration of the thickness of the arc tube (hereinafter, also called the "bulb") and the like. The reason for this is that the added rare gas exerts strong influences on the thermal behavior and the arc characteristic within the arc tube when the molar ratio of the added rare gas relative to the mercury which has been added at the same time is large.

Furthermore, the objects of the invention are achieved in a UV emission device which comprises:

a mercury lamp of the short arc type in which in a silica glass arc tube there are an anode and cathode opposite one another and mercury and rare gas are added; and a power source which supplies a given power to this mercury lamp, by the amount of mercury added being less than 1.0 mg/cc of arc tube inside volume, by argon (Ar) being used as the rare gas with a pressure of 1.0 to 8 atm at room temperature, and by the condition $0.211 \leq ((Wd)^{1/2}/R) \leq 0.387$ being met, where R half the maximum diameter of the arc tube in the radial direction in cm, d is the thickness of the arc tube in cm, and W is the input power which is supplied by the power source to the mercury lamp in kW, the radial direction being defined as the direction of the cross section which is perpendicular to the axial direction which runs between the anode and the cathode.

The objects are achieved in another aspect of the invention in that, when using krypton as the rare gas, the condition $0.205 \leq ((Wd)^{1/2}/R) \leq 0.418$ is met.

The objects are achieved in still another aspect of the invention, when using a gas mixture of argon and krypton as the rare gas, the condition $0.209 \leq ((Wd)^{1/2}/R) \leq 0.387$ is met.

In the following the invention is further described using several embodiments shown in the drawings.

BRIEF DESCRIPTION OF THE DRAWINGS

FIGS. 5 through 7 are tables, each of contain test results which show the action of the invention.

DETAILED DESCRIPTION OF THE INVENTION

Figure 2:
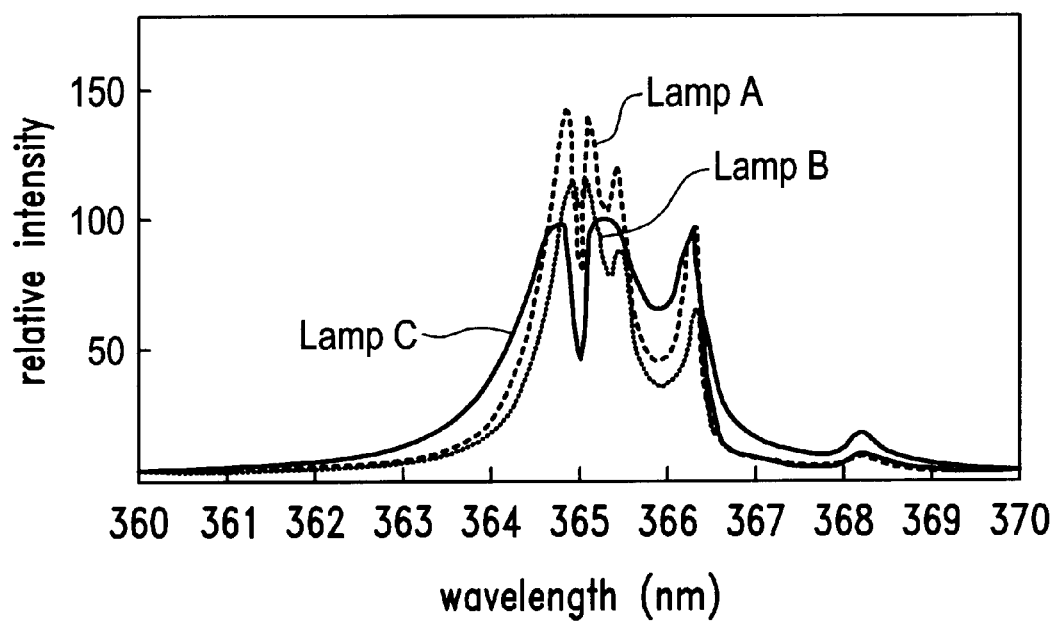
FIG. 2 is a graph depicting a comparison of the spectra around 365 nm for three mercury lamp, one being in accordance with the invention, one being a modified form thereof and the third being of conventional design.

FIG. 2 shows a comparison of the spectra around 365 nm for mercury lamps (A), (B), and (C). Mercury lamp (A) relates to a mercury lamp in accordance with the invention. In mercury lamp (B), the amount of mercury is identical to that in accordance with the invention, but xenon is added as the rare gas. The mercury lamp (C) is a typical example of a conventional mercury lamp with an amount of mercury that is at least equal to 1.0 mg/cc.

Figures 3, 4:
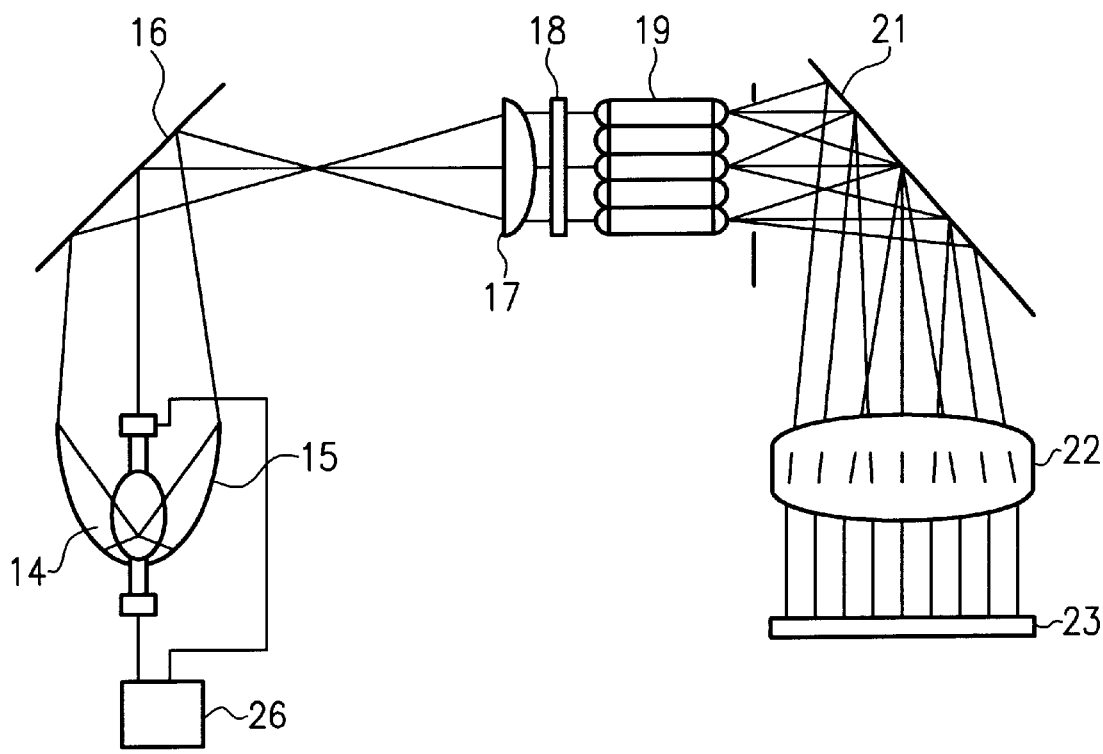
FIG. 3 is a table which shows the spectral distribution of the radiation by the mercury lamps whose spectra are depicted in FIG. 2.
FIG. 4 is a schematic representation of a UV emission device in accordance with the invention.

FIG. 3 shows specific filling amounts of mercury and of the rare gas and the irradiance in the above described mercury lamps (A), (B) and (C). Lamp (A) is filled with 0.8 mg/cc mercury and 5 atm argon gas, lamp (B) with 0.8 mg/cc mercury and 5 atm xenon gas, and lamp (C) with 5.0 mg/cc mercury and 1 atm xenon gas.

For each lamp, the radiation intensity in the range of 365±5 nm, the radiation intensity in the range of 365±0.5 nm and the degree of band narrowing based on the ratio of the two relative to one another are shown. Specifically, the expression "degree of band narrowing" is defined as the following, as can also be taken from the drawings: integrated value of (364.5 nm to 365.5 nm)/integrated value of (360 nm to 370 nm).

Furthermore, the term "radiation intensity" is defined as the relative value in the same region when the radiation intensity in the range of 365±5 rim of lamp (C) is designated 100.

When lamp (C) in FIG. 2 is compared to lamps (A) and (B), it becomes apparent that a narrowing of the band region of the i-line (365±0.5 nm) can be achieved when the amount of mercury is reduced, specifically fixed as less than 1.0 mg/cc. If the degree of band narrowing ("Purity of the i-line") in FIG. 3 is examined, it becomes clear that it is 0.36 in lamp (C), while in lamps (A) and (B) it is higher, specifically 0.50.

In FIG. 2, if lamp (A) is compared to lamp (B), it becomes clear that lamp (A) has a higher peak value at 365±0.5 nm than lamp (B), and that the integrated value in this range is larger, and therefore, the irradiance is larger. More specifically, FIG. 3 shows that the integrated value at 365±0.5 nm in lamp (A) is 53, while the integrated value in lamp (B) has a lower value of 38.

In FIG. 2, the radiation intensity of all lamps at 365 nm has dropped; this is caused by the self-absorption of the mercury in this range.

The invention was explain above with reference to the reduction of the amount of mercury and the addition of argon and krypton in given amounts.

In the following, other versions of the invention are described. Specifically it is described that a mercury lamp which is filled with argon and krypton has an influence on the arc characteristic.

An experiment confirms that, in a mercury lamp which has been filled with argon, weakly cooled "nonvaporization of mercury" occurs more often than in a mercury lamp which is filled with Xe. This shows that the lamp which has been filled with Ar is easily influenced by cooling conditions, such as air blow-out and the like. Furthermore, it was confirmed that, in this case, greater fluctuations of the arc occur than in the mercury lamp which is filled with Xe.

The reason for the above described nonvaporization of the mercury and the fluctuations of the radiant light due to the effect of the cooling conditions is not entirely clear. But, it can be imagined that the reason for it lies in the different thermal conductivities of the Ar gas and the Xe gas. When this thermal conductivity is high, the transmission rate of the thermal energy increases. The temperature in the arc center is easily transmitted into the vicinity of the inside surface of the bulb, while vice versa the temperature of the vicinity of the inside surface of the bulb is easily transferred to the arc center. Here, the thermal conductivities K of the Ar gas, the Kr gas and the Xe gas ($10^{-4}$ W/cm/K) are in the sequence (Ar: 1.63)>(Kr: 0.88)>(Xe: 0.50). The mercury lamp which is filled with Ar gas or Kr gas is more easily influenced by air blast cooling of the outside surface of the bulb or similar conditions than the mercury lamp filled with Xe gas. This leads to a temperature drop in the vicinity of the inside surface of the bulb and to a temperature drop in the arc center.

In the following, the heat transfer is described with respect to the temperature inside and outside of the bulb using a simple model. The inventors present this model as follows:

First, the temperature of the outside surface of the bulb is considered. The lamp is a symmetrical, round bulb with an outside radius of Ro and an inside radius of Ri. The thickness d of the bulb is computed according to the following formula (1).

$$d = Ro - Ri \quad (1)$$

The electrical input power supplied to the lamp is designated W. The arc discharge takes place essentially in the center of the round bulb and its size compared to the inside radius of the bulb is sufficiently smaller.

The supplied energy which is consumed in the arc is partially converted into light energy, while the other part is converted into internal energy of the added gas and heat energy for the electrodes. Some of the light energy passes through the bulb and is emitted to the outside while the remainder is absorbed by the bulb and thus becomes a heat source of the bulb. The added gas is carried by convection within the lamp, approaches the bulb, collides with the bulb and releases energy and also becomes a heat source of the bulb.

The input energy supplied to the lamp therefore passes in part as light energy through the bulb and is emitted to the outside, while another part is emitted from the heated bulb as heat energy and the remainder is emitted by the heated bulb by convective heat transfer as heat energy. In doing so, if the ratio of the light energy which passes through the bulb and which is emitted to the outside to the supplied energy is designated a, the equation of energy conservation with respect to the supplied energy W (the energy supplied to the lamp), viewed macroscopically, is computed using the following formula:

$$W = \alpha W + S \epsilon \rho To^4 + Sh(To - Te) \quad (2)$$

This means that the supplied energy (W) which is consumed in the arc is composed of the light energy (uW) which passes through the bulb and which is emitted to the outside, the heat energy ($S\epsilon\rho To^4$) which is emitted by the heated bulb, and the heat energy ($Sh(To-Te)$) which is emitted from the likewise heated bulb by convective heat transfer.

The above described equation (2) can furthermore be converted as follows:

$$(1-\alpha)W/S = \epsilon \rho To^4 + h(To - Te) \quad (2)$$

Here:
S: outside area of the bulb sphere and is equal to $4\pi Ro^2$.
$\epsilon$: emission capacity of the silica glass bulb and in the IR range it is roughly 1.
$\sigma$: Stefan-Boltzmann constant, $5.67 \times 10^{-8}$ W/m² K⁴.
h: heat transfer coefficient, 0.003 to 0.015 W/cm² K.
To: temperature of the outside surface of the bulb.
Te: equilibrium temperature (roughly 300 K) of the cooling air at a position which is relatively remote from the lamp.
$\alpha$: Ratio of the light energy which passes through the bulb and which is emitted to the outside, to the supplied energy.

It is generally known that, in Xe gas, the radiation efficiency of uninterrupted radiation is greater than in Ar gas or Kr gas. The $\alpha$ value of the Ar gas or the Kr gas is therefore less than that of the Xe gas. This means that in a mercury lamp which is filled with Ar or Kr gas, the proportion of energy which is used to heat the bulb is higher than in a mercury lamp which is filled with Xe gas when the same energy W is supplied to the lamp.

Next, the temperature of the inside surface of the bulb is considered. When this temperature of the inside surface of the bulb is too high, devitrification of the bulb occurs. If it is too low, the mercury does not vaporize.

The temperature of the inside surface of the bulb is designated Ti. The energy which is received by the bulb and which is converted into heat is designated $S\epsilon\rho To^4 + Sh(To-Te)$. If this value is called Pin, the energy which is incident on the bulb is designated as follows:

$$Pin = (1-\alpha)W \quad (3)$$

When the thermal conductivity of the silica glass bulb is designated $\lambda$, based on the equation of heat conduction, the following equation is obtained which fixes the temperature of the inside and the outside of the bulb, when a round bulb is assumed:

$$Ti - To = (Pin/4\pi\lambda)(1/Ri - 1/Ro) \quad (4)$$

Here, Ti is the temperature of the inside surface of the bulb, To is the temperature of the outside surface of the bulb, Ri is the inside radius of the bulb and Ro is the outside radius of the bulb. The typical value of the thermal conductivity $\lambda$ is 1 to 2 (W/m/K). The thickness d of the bulb is relatively smaller than the outside radius Ro of the bulb. Therefore, d<<Ro is obtained. The second term (1/Ri-1/Ro) of the right-hand side of the above relationship (4) is therefore ((Ro-Ri)/Ri×Ro). Since the thickness d of the bulb is relatively less than the outside radius Ro of the bulb, Ri=Ro. If this value is called R, $(d/R^2)$ is obtained. Furthermore, if the temperature difference Ti-To is designated $\delta T$, formula (4) can then be represented as follows:

$$\delta T = (Pin/4\pi\lambda)d/R^2 \quad (5)$$

or $$\delta T = ((Wd)^{1/2}/R)^2(1-\alpha)/(4\pi\lambda) \quad (6)$$

Based on the formula (6), the temperature Ti of the bulb inside is computed according to the following formula:

$$Ti - To((Wd)^{1/2}/R)^2(1-\alpha)/(4\pi\lambda) \quad (7)$$

This formula shows that the temperature Ti of the inside surface of the bulb is strongly related to "$((Wd)^{1/2}/R)$" which is fixed by the electrical input power W that is supplied to the lamp, the thickness d of the bulb and the radius R of the bulb.

A lamp which is filled with Ar gas or Kr gas has a greater thermal conductivity due to this rare gas than a lamp which is filled with Xe gas. Heat transfer between the temperature in the arc center and the temperature in the vicinity of the inside surface of the bulb therefore takes place easily. Furthermore the ratio of the energy use for increasing the bulb temperature is high when the same energy is supplied to the lamp. Therefore, it was ascertained that, in this lamp, the thermal effect must be adequately considered within the bulb. It was found that it is a good idea to fix the variable "$((Wd)^{1/2}/R)$" within a defined range in order to advantageously eliminate the defects of nonvaporization of the mercury at an overly low temperature of the inside surface of the bulb and devitrification of the bulb at an overly high temperature of the inside surface of the bulb.

Figure 1:
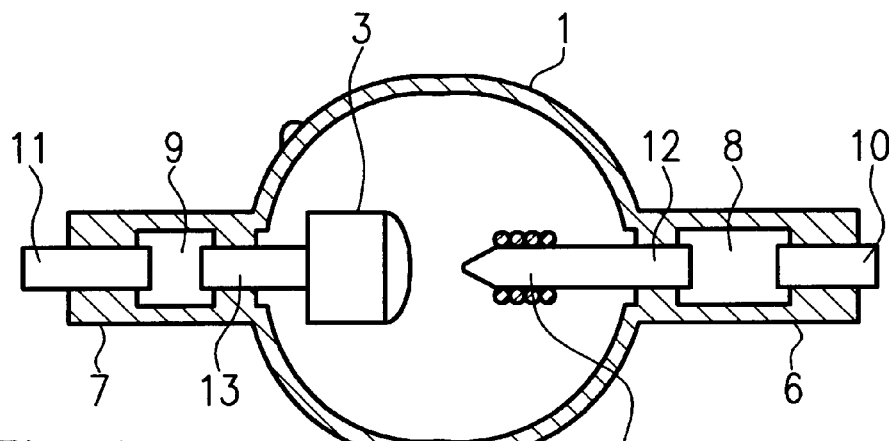
FIG. 1 is a schematic cross-sectional view of a mercury lamp of the short arc type in accordance with the invention.

FIG. 1 shows a schematic cross section of one embodiment of a mercury lamp of the short arc type according to the invention. In the representation, an arc tube 1 of silica glass contains a cathode 2 and an anode 3 in an opposed spaced relationship relative to each other. The electrodes are each connected to foils 8 and 9 via inner lead components 12 and 13 in hermetically sealed portions 6 and 7. The outer lead components 10 and 11 are connected to metal foils 8 and 9, respectively.

In the following, specific construction examples of such a mercury lamp of the short arc type are described.

The arc tube 1 is made of silica glass, has an outside diameter of roughly 55 mm, and is made roughly spherical. The cathode 2 is made of tungsten which contains roughly 2% by weight thorium oxide, is made rod-shaped, and has a diameter of roughly 6.0 mm.

The vicinity of the tip of the rod-shaped cathode is wound with a tungsten coil and its tip that faces anode 3 is conical and made of tungsten. The base of conic tip of the cathode 2 has a diameter of 20 mm. The tip of the anode 3 facing the cathode 2 is rounded. The distance between the cathode 2 and the anode 3 is 4.0 mm, and the interior volume of the arc tube is roughly 75 cc.

The arc tube is filled with 0.8 mg/cc mercury and 5.0 atm of argon gas. One such mercury lamp of the short arc type is operated, for example, with a rated voltage of 23 V and a nominal wattage of 2 kW.

With respect to "$(Wd)^{1/2}/R$" the following is noted.

First, an experiment was conducted which shows the devitrification of the bulb and the nonvaporization of the mercury in conjunction with half the value of the maximum diameter of the arc tube (the bulb) R (cm), the thickness d (cm) of the bulb, and the input power W (kW) supplied to the lamp in a mercury lamp which is filled with argon.

Here, the expression "maximum diameter of the bulb" is defined as the maximum diameter of a cross section which is perpendicular to the axial direction, that is, to the direction between the anode and the cathode. In the experiment, five different mercury lamps filled with 3 atm argon at room temperature were prepared, the above described parameters were each changed, and the respective lamp was studied using the value of $(Wd)^{1/2}/R$.

Specifically, the mercury lamps have the following specifications.

An anode of tungsten with a diameter of 20 mm and a cathode of tungsten which contains roughly 2% by weight thorium oxide are disposed opposite one another in a roughly spherical arc tube of silica glass. Mercury is added in an amount of 4.5 mg/cc of lamp interior volume.

FIG. 5 shows the results. In lamp X1, 20 hours after the start of operation, on the inside of the bulb, devitrification has progressed rapidly and radiation has dropped quickly. This is presumably because the temperature of the bulb inside was too high and therefore devitrification has progressed. In lamp X5, the lamp voltage fluctuated immediately after the start of operation and the radiation was not stabilized. In observing the lamp during operation, furthermore nonvaporization of the mercury on the inside of the bulb was confirmed.

In the following, a corresponding experiment is described for a mercury lamp filled with krypton.

In the experiment, five different mercury lamps filled with 3 atm krypton at room temperature were prepared, the above described parameters were each changed, and the respective lamp was studied using the value of $(W^{1/2}/R)$. The particular specification of the mercury lamps is identical to the above described case of filling with argon. FIG. 6 shows the result.

In lamp Y1, it was confirmed that 20 hours after the start of operation on the inside of the bulb devitrification had progressed and a rapid decrease of radiation had taken place. This is presumably due to the fact that the temperature of the inside of the bulb was too high and therefore devitrification had progressed. In lamp Y5, the lamp voltage fluctuated immediately after the start of operation and the radiation was not stabilized. In observation of the lamp during operation, the nonvaporization of the mercury on the inside of the bulb was confirmed.

In the following, a corresponding experiment for a mercury lamp which is filled with argon and krypton is described.

In the experiment, five different mercury lamps filled with 1.5 atm argon, 1.5 atm krypton and 0.5 atm xenon each at room temperature were prepared, the above described parameters were each changed, and the respective lamp was studied using the value of $(Wd)^{1/2}/R$. The particular specification of the mercury lamps is identical to the above described case of filling with argon and krypton. FIG. 7 shows the result.

In lamp Z1, it was confirmed that 20 hours after the start of operation on the inside of the bulb devitrification had rapidly progressed and a rapid decrease of radiation has taken place. This is presumably due to the fact that the temperature of the inside of the bulb was too high and therefore devitrification had progressed. In lamp Z5, the lamp voltage fluctuated immediately after starting operation and the radiation was not stabilized. In observation of the lamp during operation, the nonvaporization of the mercury on the inside of the bulb was confirmed.

Furthermore, in the above described mercury lamp of the short arc type fluctuations of the cathode spot can be suppressed by operation in a lamp position in which the anode is pointed upward.

In the UV emission device in accordance with the invention the optical system shown in FIG. 4 is used. In this way, irradiation with high focusing efficiency is enabled.

FIG. 4 schematically shows an exposure device for which a mercury lamp of the short arc type according to the invention is used. The light emerging from the lamp 14 passes to an oval mirror 15 and a first flat reflector 16, reaches a collimator 17 and a bandpass filter 18 with a primary wavelength of 365 nm and a bandwidth of 10 nm, passes through an integrator lens 19, is reflected by a second flat reflector 21, passes through a condenser lens 22, and reaches a mask surface 23. A power source 26 is connected to the lamp 14. In an actual exposure device according to the invention there is an optical system underneath the mask surface 23, but in the case shown, it has been omitted.

According to the invention, cases were described in which argon, krypton or a mixture of these gases was added as the rare gas. But other rare gases, specifically helium, neon or xenon can also be added for this purpose.

Furthermore, the inventors have found that, even when using helium or neon instead of argon or krypton, it is possible to contribute to increasing the irradiance. But, since helium and neon easily escape to the outside via the silica glass, it is difficult to maintain the irradiance over a long time. This measure is therefore not practical.

Action of the Invention

As was described above, in a mercury lamp of the short arc type in which an anode and a cathode are disposed opposite one another in a silica glass arc tube which is filled with mercury and a rare gas, the invention is characterized by the fact that the amount of mercury added is less is no greater than 1.0 mg/cc of the inside volume of the arc tube, and that, for the rare gas, at least argon (Ar) or krypton (Kr)

or a mixture of these gases is added at room temperature with a pressure of 1.0 to 8.0 atm.

By means of this measure, a mercury lamp of the short arc type can be obtained which possesses sufficient irradiance and a relatively intense spectrum at 365 nm with an extremely narrowed band region.

What we claims is:

1. Mercury lamp of the short arc type comprising an anode and a cathode disposed opposite one another in a silica glass arc tube which is filled with mercury and a rare gas; wherein the mercury is in an amount which is less than 1.0 mg/cc of the inside volume of the arc tube; and wherein the rare gas comprises at least one of argon (Ar) and krypton (Kr) at room temperature pressure of 1.0 to 8.0 atm, wherein the rare gas is argon; and wherein the relationship $0.211 \leq ((Wd)^{1/2}/R) \leq 0.387$ is met, where R is half the maximum diameter of the arc tube in a radial direction in cm, d is the thickness of the arc tube in cm, the radial direction being defined as a cross-sectional direction which is perpendicular to an axial direction running between the anode and the cathode, and W is the input power in kW.

2. Mercury lamp of the short arc type comprising an anode and a cathode disposed opposite one another in a silica glass arc tube which is filled with mercury and a rare gas; wherein the mercury is in an amount which is less than 1.0 mg/cc of the inside volume of the arc tube; and wherein the rare gas comprises at least one of argon (Ar) and krypton (Kr) at room temperature pressure of 1.0 to 8.0 atm, wherein the rare gas is krypton; and wherein the relationship $0.205 \leq ((Wd)^{1/2}/R) \leq 0.418$ is met, where R is half the maximum diameter of the arc tube in a radial direction in cm, d is the thickness of the arc tube in cm, the radial direction being defined as a cross-sectional direction which is perpendicular to an axial direction running between the anode and the cathode, and W is the input power in kW.

3. Mercury lamp of the short arc type comprising an anode and a cathode disposed opposite one another in a silica glass arc tube which is filled with mercury and a rare gas; wherein the mercury is in an amount which is less than 1.0 mg/cc of the inside volume of the arc tube; and wherein the rare gas comprises at least one of argon (Ar) and krypton (Kr) at room temperature pressure of 1.0 to 8.0 atm, wherein the rare gas comprises a gas mixture of argon and krypton; and wherein half the maximum diameter of the arc tube in a radial direction R in cm, the thickness of the arc tube d in cm, the radial direction R being defined as a cross-sectional direction which is perpendicular to an axial direction running between the anode and the cathode, and the input power W in kW fulfills the relationship $0.209 \leq ((Wd)^{1/2}/R) \leq 0.387$.

4. UV emission device, which comprises:

a mercury lamp of the short arc type in which in a silica glass arc tube contains an anode and cathode disposed opposite one another, mercury and a rare gas; and a power source which supplies a predetermined power to the mercury lamp;

wherein the mercury is contained in an amount less than 1.0 mg/cc of the arc tube inside volume;

wherein the rare gas is argon at room temperature pressure of 1.0 to 8.0 atm; and wherein the relationship $0.211 \leq ((Wd)^{1/2}/R) \leq 0.387$ is met, where R is half the maximum diameter of the arc tube in a radial direction in cm, d is the thickness of the arc tube in cm, the radial direction being defined as a cross-sectional direction which is perpendicular to an axial direction running between the anode and the cathode, and W is the input power in kW.

5. UV emission device, which comprises:

a mercury lamp of the short arc type in which in a silica glass arc tube contains an anode and cathode disposed opposite one another, mercury and a rare gas; and a power source which-supplies a predetermined power to the mercury lamp;

wherein the mercury is contained in an amount less than 1.0 mg/cc of the arc tube inside volume;

wherein the rare gas is krypton at room temperature pressure of 1.0 to 8.0 atm; and wherein the relationship $0.205 \leq ((Wd)^{1/2}/R) \leq 0.418$ is met, where R is half the maximum diameter of the arc tube in a radial direction in cm, d is the thickness of the arc tube in cm, the radial direction being defined as a cross-sectional direction which is perpendicular to an axial direction running between the anode and the cathode, and W is the input power in kW.

6. UV emission device, which comprises:

a mercury lamp of the short arc type in which in a silica glass arc tube contains an anode and cathode disposed opposite one another, mercury and a rare gas; and a power source which supplies a predetermined power to the mercury lamp;

wherein the mercury is contained in an amount less than 1.0 mg/cc of the arc tube inside volume;

wherein the rare gas comprises a gas mixture of argon and krypton at room temperature pressure of 1.0 to 8.0 atm; and wherein half the maximum diameter of the arc tube in a radial direction R in cm, the thickness of the arc tube d in cm, the radial direction R being defined as a cross-sectional direction which is perpendicular to an axial direction running between the anode and the cathode, and the input power W in kW fulfills the relationship $0.209 \leq ((Wd)^{1/2}/R) \leq 0.387$.

\* \* \* \* \*